United States Patent
Steinle et al.

(10) Patent No.: US 7,075,961 B2
(45) Date of Patent: Jul. 11, 2006

(54) LASER DIODE WITH VERTICAL RESONATOR AND METHOD FOR FABRICATING THE DIODE

(75) Inventors: Gunther Steinle, München (DE); Hans-Dietrich Wolf, Höhenbrunn (DE)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 10/653,794

(22) Filed: Sep. 3, 2003

(65) Prior Publication Data

US 2004/0042517 A1  Mar. 4, 2004

Related U.S. Application Data

(63) Continuation of application No. PCT/DE02/00337, filed on Jan. 25, 2002.

(51) Int. Cl.
*H01S 5/00* (2006.01)
(52) U.S. Cl. .......................................... 372/43; 372/45
(58) Field of Classification Search ................. 372/43, 372/44, 45, 46
See application file for complete search history.

(56) References Cited

U.S. PATENT DOCUMENTS

| 5,262,360 | A |   | 11/1993 | Holonyak, Jr. et al. |       |
|-----------|---|---|---------|----------------------|-------|
| 5,557,626 | A |   | 9/1996  | Grodzinski et al.    |       |
| 5,881,085 | A | * | 3/1999  | Jewell               | 372/46|
| 6,014,395 | A | * | 1/2000  | Jewell               | 372/45|
| 2002/0101899 | A1 | * | 8/2002 | Yokouchi et al.     | 372/46|

FOREIGN PATENT DOCUMENTS

| EP | 0 939 471 A1 | 9/1999 |
| JP | 06029611 A   | 2/1994 |
| JP | 10200210 A   | 7/1998 |

* cited by examiner

Primary Examiner—Minsun Oh Harvey
Assistant Examiner—Dung Nguyen
(74) Attorney, Agent, or Firm—Laurence A. Greenberg; Werner H. Stemer; Ralph E. Locher

(57) ABSTRACT

The invention relates to a laser diode including a vertical resonator and to a method for producing the laser diode such that at least one active layer is configured between reflective layers. The invention is characterized by configuring at least one antioxidation layer between the reflective layers, thus preventing distortion caused by unintentional oxidation. The antioxidation layer consists of a III–V semiconductor material with a proportion of a molar aluminum of less than 0.7 and/or a III–V semiconductor material with an optical depth of at least two quarter waves.

49 Claims, 3 Drawing Sheets

LASER DIODE WITH VERTICAL RESONATOR AND METHOD FOR FABRICATING THE DIODE

CROSS-REFERENCE TO RELATED APPLICATION

This application is a continuation of copending International Application No. PCT/DE02/00337, filed Jan. 25, 2002, which designated the United States and was not published in English.

BACKGROUND OF THE INVENTION

FIELD OF THE INVENTION

The invention relates to a laser diode having a vertical resonator with an active layer disposed between reflector layers. The invention also relates to an associated fabrication method.

Laser diodes with a vertical resonator are known as VCSELs (vertical cavity surface emitting lasers). Unlike edge-emitting lasers, a VCSEL amplifies light transverse to a layer structure. There is an active layer disposed between vertically stacked reflector layers.

VCSELs are typically produced by etching a simple or compound mesa structure and subsequently carrying out wet thermal oxidation. A selective oxidation is purposefully performed for a few layers in order to generate a defined current path (current aperture) and a defined index guidance. For instance, U.S. Pat. No. 5,262,360 describes how to purposefully oxidize $Al_xGa_{1-x}As$ layers (with x>0.7) in which the aluminum fraction is very high.

The reflector layers (Bragg reflectors) above and below the active layer partly include a high aluminum fraction in order to achieve good reflection characteristics. During the fabrication of the required oxide layers (e.g. current aperture), these reflector layers with a high aluminum content are unintentionally oxidized. This unintended oxidation is disadvantageous, because a conversion of the semiconductor material into an oxide gives rise to local deformation in the material as a result of the volume changes. In order to avoid these problems, the intentionally oxidized layers have hitherto been constructed very thin (between 15 and 30 nm). But the unintentionally oxidized layers cannot be made arbitrarily thin, because a defined thickness (e.g. $\lambda/4n$) is needed for optimal reflection characteristics. Given an emission wavelength of $\lambda=850$ nm and a refractive index of approximately n=3, the thickness should be approximately 70 nm. Given that VCSEL structures typically have between 60 and 70 reflector pairs, up to 70 layers with high aluminum fractions are unintentionally oxidized, which leads to substantial deformation in the outer region of the etched mesa.

SUMMARY OF THE INVENTION

It is accordingly an object of the invention to provide a laser diode with a vertical resonator and a method for fabricating the laser diode, which overcome the above-mentioned disadvantages of the prior art apparatus and methods of this general type.

In particular, it is an object of the present invention to provide a laser diode with a vertical resonator in which the deformations that are caused by unintended oxidation are reduced.

Namely, the object is achieved by placing at least one antioxidation layer between the reflector layers of a vertical resonator. The antioxidation layer consists of a III–V semiconductor material with a molar aluminum fraction of less than 0.7 and/or a III–V semiconductor material with an optical thickness of at least two quarter-wavelengths. A layer with a reduced oxidation rate is thereby created, and/or controlled etching to a layer with a low oxidation rate is ensured. The setting of the aluminum content and the selection of the thickness of the antioxidation layer can separately or in combination serve to effectuate a reduced oxidation rate.

The small molar aluminum fraction reduces the oxidation propensity of the antioxidation layer. Local deformations as a result of the increase in volume in the material are thereby minimized. Reducing the local deformations improves the reliability of the laser diode. The defect concentration in the region of the active layer is also improved because of the reduction of the oxide-semiconductor interfaces.

Another advantage of the antioxidation layer is the improved adhesion of dielectric layers or polymer layers and a simplified re-etching following oxidation, based on the fact that little oxide, if any, has to be removed.

It is advantageous when an antioxidation layer consists of $Al_xGa_{1-x}As$ or $In_yAl_xGa_{1-x-y}As_{1-z}P_z$. The quintary material forms a chemical etch stop layer. It is advantageous that the thickness of the antioxidation layer is not critical in that case.

It is also advantageous when at least one antioxidation layer is dispose above an active layer and/or at least one antioxidation layer is disposed below an active oxidation layer. If the antioxidation layer is disposed above the active layer, this layer is not impaired by an oxidation step. If the antioxidation layer is disposed below the active layer, a current aperture that is produced above the active layer by selective oxidation, for example, can be close to the active layer.

In another advantageous development of the inventive laser diode, an antioxidation layer and an active layer are disposed in a layer structure without an additional layer being interposed between them.

The antioxidation layer advantageously has an optical thickness of at least two quarter-wavelengths. It is particularly advantageous when at least one antioxidation layer is constructed as an etch stop and/or etch runout layer.

When at least one antioxidation layer is at least partly modulation-doped, absorption losses can be minimized.

Further reduction of the local deformation in the material can be achieved when at least one reflector layer that is disposed near an active layer has a molar aluminum fraction of less than 0.9. This reflector layer thus oxidizes less.

A low-deformation laser diode is achieved when at least one antioxidation layer consisting of a III–V semiconductor material with a molar aluminum fraction of less than 0.7 and/or at least one antioxidation layer consisting of a III–V semiconductor material with an optical thickness of at least two quarter-wavelengths is provided between the reflector layers.

The advantage of utilizing a layer with the above cited optical thickness, is that a substantial change in the index of refraction occurs at the antioxidation layer following the etch-through of the reflector layers. It is possible to effectively detect the change during the process, so that the process can be better controlled.

In an advantageous method, an antioxidation layer is incorporated which consists of $Al_xGa_{1-x}As$ or consists of a chemically selective etch stop layer, particularly $In_yAl_xGa_{1-x-y}As_{1-z}P_x$.

With the foregoing and other objects in view there is also provided, in accordance with the invention, a method for fabricating a laser diode. The method includes steps of:

providing the laser diode with a vertical resonator having at least one active layer disposed between reflector layers; and providing at least one antioxidation layer consisting of a III–V semiconductor material with an optical thickness of at least two quarter-wavelengths and configuring the antioxidation layer between the reflector layers.

In accordance with an added mode of the invention, the III–V semiconductor material of the antioxidation layer has a molar aluminum fraction of less than 0.7.

In accordance with an additional mode of the invention, the antioxidation layer consists of $Al_xGa_{1-x}As$.

In accordance with another mode of the invention, the antioxidation layer consists of a chemically selective etch stop layer.

In accordance with a further mode of the invention, the antioxidation layer consists of $In_{y}Al_xGa_{1-x-y}As_{1-z}P_z$.

Other features which are considered as characteristic for the invention are set forth in the appended claims.

Although the invention is illustrated and described herein as embodied in a laser diode with vertical resonator and method for fabricating the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
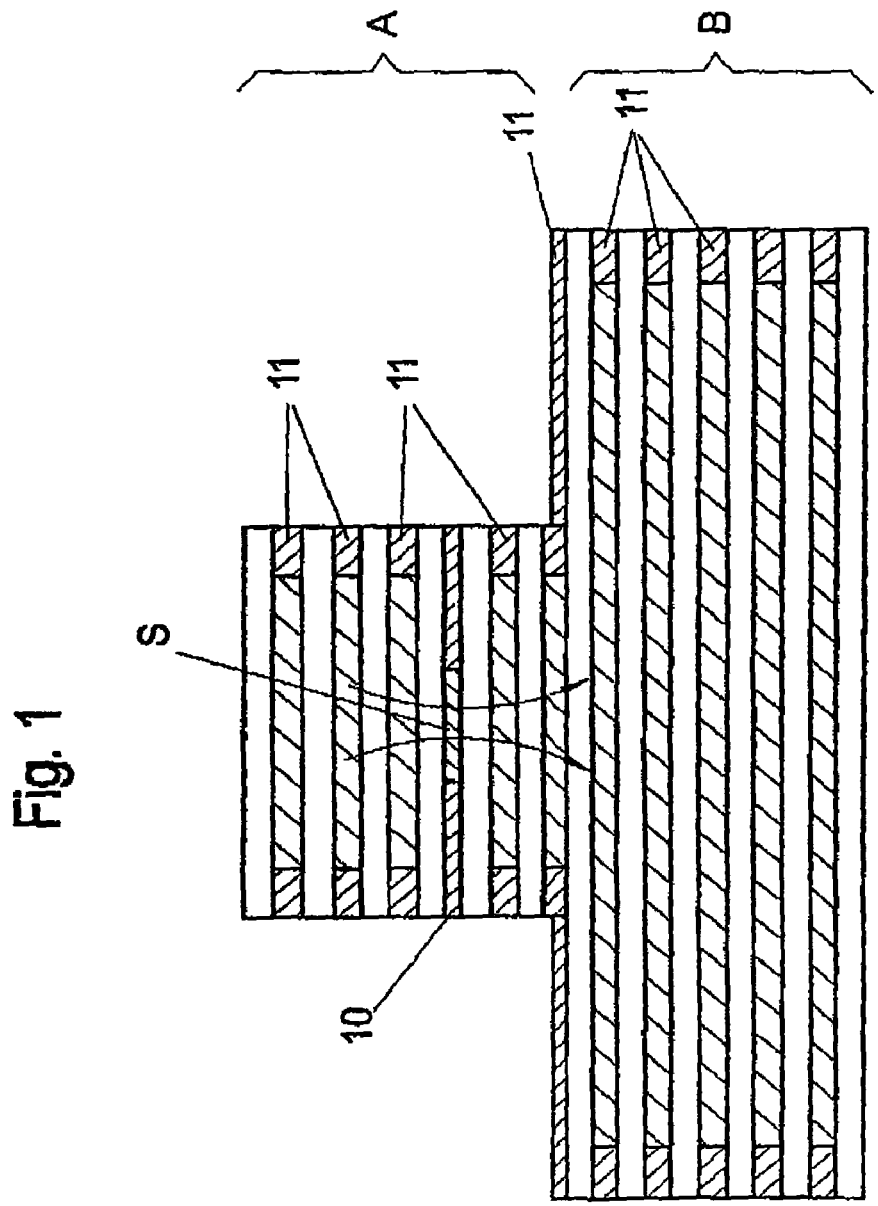
FIG. 1 is a schematic cross-sectional view of a prior art laser diode with a vertical resonator.

Referring now to the figures of the drawing in detail and first, particularly, to FIG. 1 thereof, there is shown a cross-sectional view through a known laser diode with a vertical resonator. The function of such a VCSEL is known in principle (e.g. Jewell et al., Vertical-Cavity Surface-Emitting Laser: Design, Growth, Fabrication, Characterization; IEEE Journal of Quantum Electronics, Vol. 27, No. 6, June 1991; p. 1332 ff; S. O. Kasap, Optoelectronics and Photonics, Principles and Practices, Prentice-Hall, 2001), and therefore the present description includes only what is essential to the invention.

Figure 2:
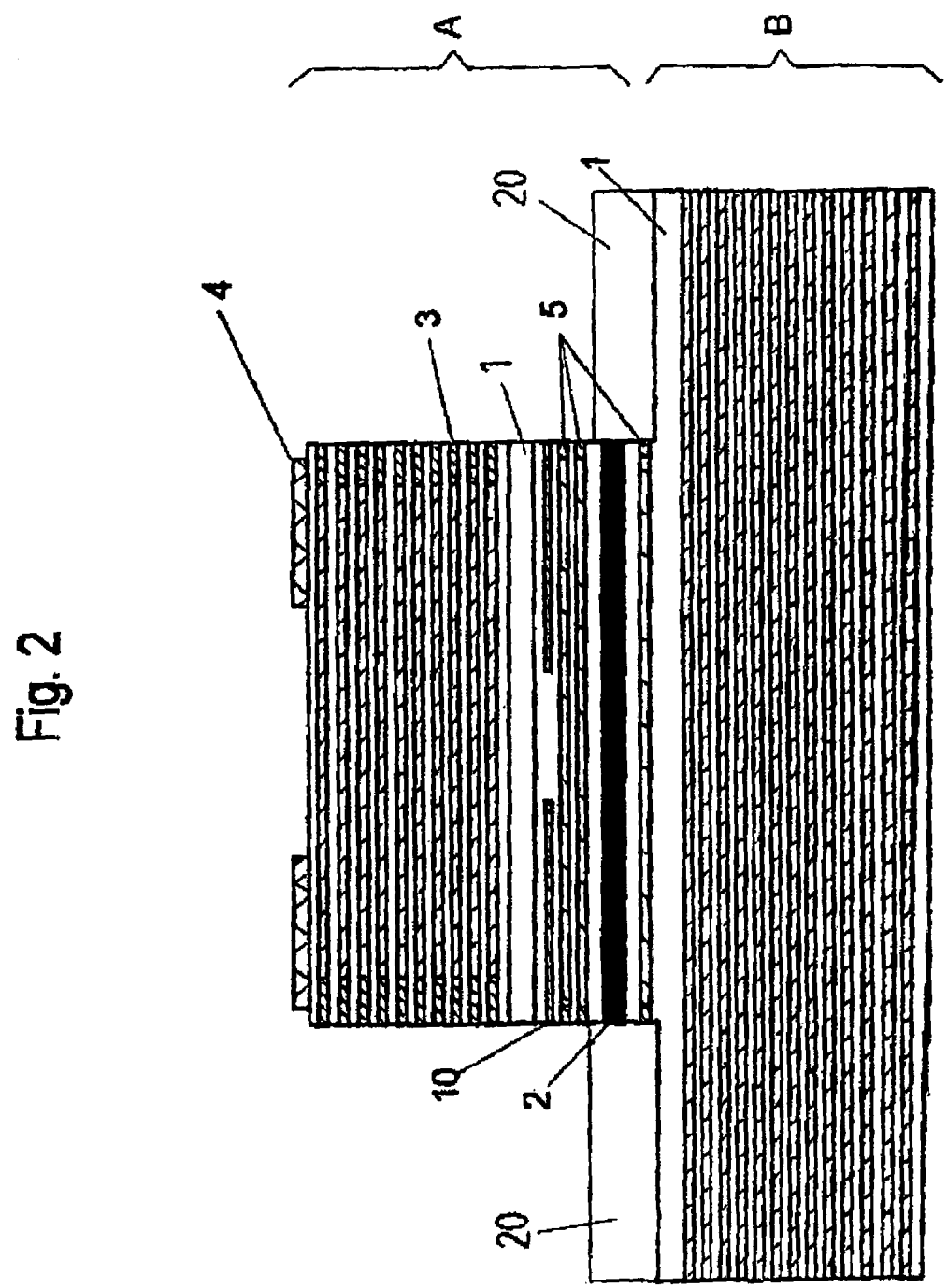
FIG. 2 is a schematic cross-sectional view of a first embodiment of an inventive laser diode with a vertical resonator.
Figure 3:
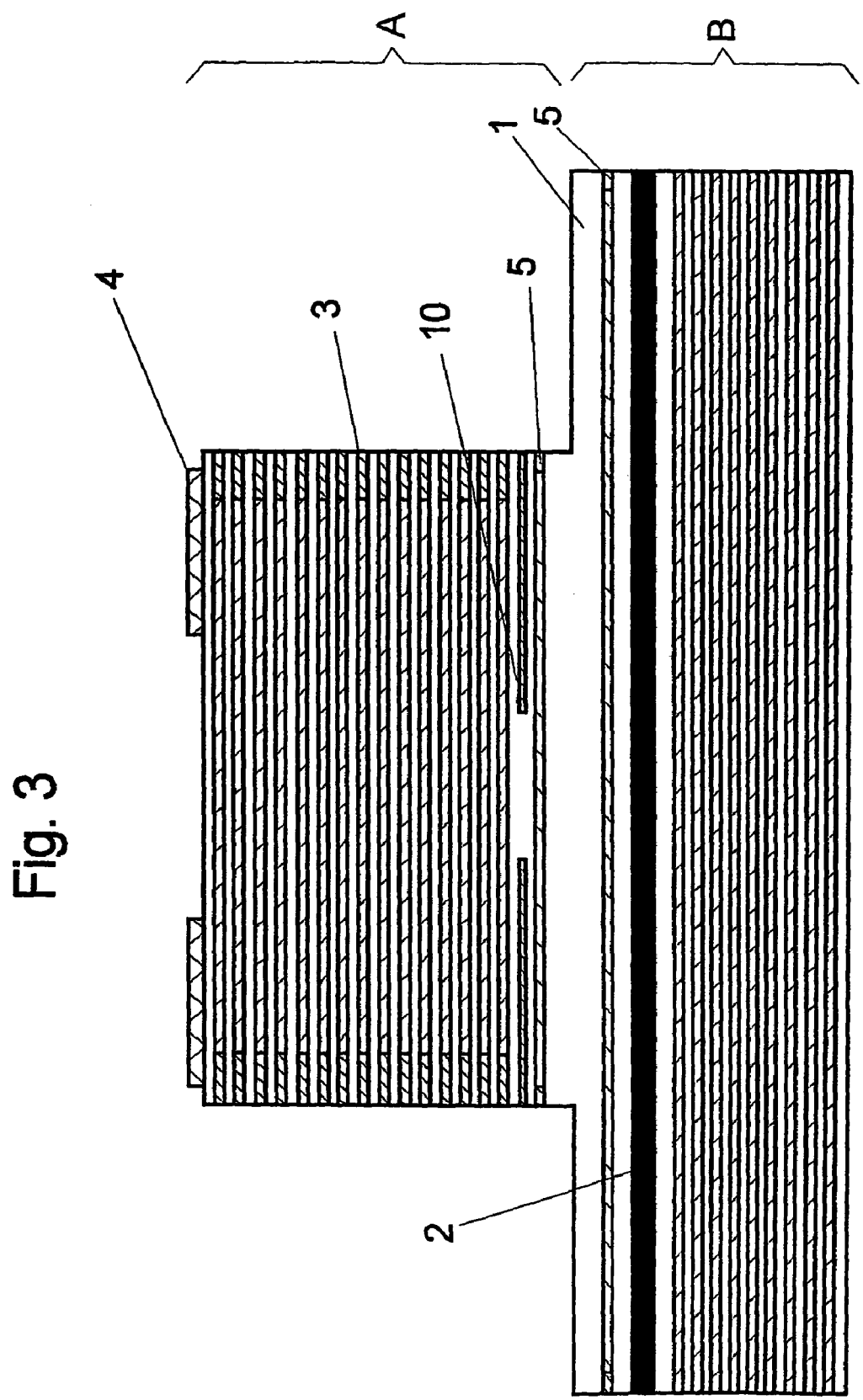
FIG. 3 is a schematic cross-sectional view of a second embodiment of the inventive laser diode with a vertical resonator.

In a VCSEL, the active layer can be disposed in the upper, small mesa A (as shown in FIG. 2) or in the lower, larger mesa B (as shown in FIG. 3). For the sake of simplicity, the active layer is not represented in FIG. 1.

The layer stack of the VCSEL includes a current aperture 10, which is disposed in the upper mesa A in this case. The current flow S with the elevated current density in the region of the current aperture 10 is indicated by arrows. The current aperture 10 is formed by an intentionally oxidized layer with a high oxidation rate.

Disposed above and below the layer with the current aperture are reflector layers, which have a high molar aluminum fraction. Reflector layers having a high aluminum fraction that have been etched through are unintentionally oxidized laterally. The regions 11 where the oxidation takes place have been represented in FIG. 1. These unintentional oxidations cause local deformations in the outer region of the etched mesa.

In the structure represented in FIG. 1, the VCSEL should be constructed as a top emitter; i.e., the laser radiation exits the layer stack at the top edge. Alternatively, bottom emitters are possible.

FIG. 2 represents a first embodiment of the inventive laser diode, which prevents these deformations.

Here, at least one antioxidation layer 1 is disposed below an active layer 2. In the second embodiment shown in FIG. 3, the configuration is reversed.

In the first exemplifying embodiment represented, an intermediate layer (here reflector layer 5) is disposed between the antioxidation layer 1 and the active layer 2 so that the two layers are not directly adjacent. Alternatively, it is also possible to dispose several other layers (e.g. reflector layers), or none at all, between the antioxidation layer 1 and the active layer 2.

The antioxidation layer 1 is formed from $Al_xGa_{1-x}As$ in this case. The molar aluminum fraction is referenced x.

Alternatively, other III–V material systems can be utilized, particularly binary, ternary, or quaternary (e.g. InGaAlAs) or quintary (e.g. $In_yAl_xGa_{1-x-y}As_{1-z}P_z$) material systems. In these systems, the molar aluminum content is analogous to the above ternary system.

The antioxidation layer 1 has a negligible oxidizing capacity; i.e., the oxidized layer is only a few nanometers thick, so that the oxide which emerges anyway can be removed by physical processes (e.g. sputtering) or chemical processes, without impairing the remaining structure. The antioxidation layer 1 inventively has a molar aluminum fraction of less than 0.7. The aluminum fraction can be selected small enough that little or no absorption occurs at the layer.

This effect was also found in inventive antioxidation layers 1 with aluminum fractions of less than 0.3, and particularly with aluminum fractions in the range between 0.2 and 0.10. These examples apply for a wavelength of 850 nm.

Basically, the aluminum fraction should be selected small in order to achieve an optimal antioxidation effect. For $Al_xGa_{1-x}As$, it is advantageous when the wavelength of the laser diode and the molar aluminum fraction of the antioxidation layer are functionally related by the following general relation:

$$0 < x <= 0.45: \lambda(\mu m) > 1.24/(1.424+1.247x)$$

$$0.45 < x < 0.7: \lambda(\mu m) > 1.24/(1.9+0.125x+0.143x^2)$$

These relations can be converted without a problem into a functional dependency of the fraction x on the wavelength $\lambda$, because the wavelength is usually prescribed. However, for this relation to apply in practice, an addition must still be made to the aluminum fraction. For $Al_xGa_{1-x}As$, the aluminum fraction reaches the above mentioned range between 0.2 and 0.1.

Though the oxidation propensity drops as aluminum content decreases, the range in particular is advantageous because it represents a lower limit for functioning because of wavelength transparency.

One of ordinary skill in the art recognizes that the molar aluminum fraction is functionally related to the wavelength of the laser diode in any event. The functional relations are either known or can be purposely detected.

The antioxidation layer 1 has a sufficient optical thickness, which can equal at least two quarter-wavelengths. The thickness of the antioxidation layer is adapted to the characteristics of the etching technique that is utilized, particularly the uniformity of the technique, so that the etching can be reliably stopped in the region of the antioxidation layer 1 or can run out in the antioxidation layer 1. The thickness of the antioxidation layer 1 also provides for space between deformed oxidized layers and the active layer 2.

Notwithstanding that, in the present case, the material properties of the antioxidation layer 1 are related to a criterion for the thickness, either criteria can be used alone for achieving the object.

The utilization of an antioxidation layer 1 prevents the forming of larger interface regions between the oxide material and the semiconductor material above and/or below the active layer 2. The interface regions could induce defects in the active region with the operation of the laser diode.

According to the first embodiment, not only is an antioxidation layer 1 utilized, but reflector layers 5 having a reduced oxidation rate are also disposed in the vicinity of the active layer 2 ($Al_xGa_{1-x}As$, with x<0.9) in order to reduce the local deformations. Because of the reduced aluminum content, less oxide volume forms, which leads to a reduction of deformations.

In order to reduce the absorption losses, the antioxidation layer 1 is modulation-doped; i.e., the regions in which the standing wave intensity in the vertical resonator is at a maximum have a lower dopant level. On the other hand, the doping in the regions with a minimal standing wave intensity is elevated.

Disposed on the top surface of the small mesa A is a p-contact 4, whereby laser light can exit in an unoccupied region (top emitter).

The second embodiment, which is represented in FIG. 3, is distinguished primarily by the antioxidation layer 1 being disposed above the active layer 2. As in the first embodiment, an intermediate layer (here reflector layer 5) is provided between the antioxidation layer 1 and the active layer 2. Alternatively, several intermediate layers or none at all can be provided.

Like in the first embodiment, the second embodiment also includes reflector layers 5 ($Al_xGa_{1-x}As$, with x<0.9) with a reduced oxidation rate in the vicinity of the active layer 2 in order to reduce local deformations. The antioxidation layer can also be modulation-doped in this case.

Since the fabrication of VCSELs is known, only a few points that are important for the inventive design will now be discussed.

In both embodiments, the oxidation is performed immediately after the first mesa etching in order to prevent oxidation below the layers that will be intentionally oxidized (e.g. current aperture).

Only one antioxidation layer 1 is represented in the two embodiments, respectively. In principle, it is also possible to utilize several such layers in a layer structure.

In principle, an antioxidation layer 1 can also be arranged above a current aperture layer 10. The layers and etch edges that lie exposed after the etching can be protected against oxidation in subsequent processing steps by using a suitable coverlayer 20 (see FIG. 2). A preferred material for the coverlayer is $CVD-SiN_x$.

The invention is not limited to the above cited exemplary embodiments. Rather, a number or variants should now be conceivable, which make use of the inventive laser diode and the method for producing it, even in fundamentally different embodiments.

We claim:

1. A laser diode, comprising:
   a vertical resonator including a plurality of reflector layers, at least one active layer disposed between said plurality of reflector layers, and at least one antioxidation layer disposed between said plurality of reflector layers;
   said antioxidation layer including a III–V semiconductor material with an optical thickness of at least two quarter-wavelengths; and
   said antioxidation layer and said active layer being configured in a layer structure without an additional layer interposed between said antioxidation layer and said active layer.

2. The Laser diode according to claim 1, wherein said antioxidation layer consists only of said III–V semiconductor material.

3. The laser diode according to claim 1, wherein said antioxidation layer consists of said III–V semiconductor material with a molar aluminum fraction of less than 0.7.

4. The laser diode according to claim 1, wherein said antioxidation layer consists of $Al_xGa_{1-x}As$ or a chemically selective etch stop layer.

5. The laser diode according to claim 1, wherein said antioxidation layer consists of $In_yAl_xGa_{1-x-y}As_{1-z}P_z$.

6. The laser diode according to claim 1, wherein said antioxidation layer is disposed above said active layer.

7. The laser diode according to claim 1, wherein said antioxidation layer is disposed below said active layer.

8. The laser diode according to claim 1, wherein said antioxidation layer is constructed as an etch stop layer and/or an etch runout layer.

9. The laser diode according to claim 1, wherein said antioxidation layer is at least partly modulation-doped.

10. The laser diode according to claim 1, wherein at least one of said plurality of reflector layers includes a molar aluminum fraction of less than 0.9.

11. The laser diode according to claim 1, wherein at least one of said plurality of reflector layers, which is adjacent said active layer, includes a molar aluminum fraction of less than 0.9.

12. A laser diode, comprising:
    a vertical resonator including a plurality of reflector layers, at least one active layer disposed between said plurality of reflector layers, and at least one antioxidation layer disposed between said plurality of reflector layers;
    said antioxidation layer including a III–V semiconductor material with an optical thickness of at least two quarter-wavelengths;
    at least one current aperture layer;
    said antioxidation layer constructed as an etch stop layer and/or an etch runout layer; and
    said antioxidation layer disposed between said plurality of reflector layers and above said current aperture layer.

13. A laser diode, comprising:
    a vertical resonator including a plurality of reflector layers, at least one active layer disposed between said plurality of reflector layers, and at least one antioxidation layer disposed between said plurality of reflector layers;
said antioxidation layer including a III–V semiconductor material with an optical thickness of at least two quarter-wavelengths;
at least one current aperture layer; and
a coverlayer provided for protecting layers that are uncovered after an etching process against oxidation during processing steps subsequent to said etching process;
said antioxidation layer disposed above said current aperture layer.

14. The laser diode according to claim 13, wherein said coverlayer is a CVD-SiN$_x$ coverlayer.

15. A method for fabricating a laser diode, which comprises:
providing the laser diode with a vertical resonator having at least one active layer disposed between reflector layers;
providing at least one antioxidation layer consisting of a III–V semiconductor material with an optical thickness of at least two quarter-wavelengths and configuring the antioxidation layer between the reflector layers; and
configuring the antioxidation layer and the active layer in a layer structure without an additional layer interposed between the antioxidation layer and the active layer.

16. The method according to claim 15, wherein the III–V semiconductor material of the antioxidation layer has a molar aluminum fraction of less than 0.7.

17. The method according to claim 15, wherein the antioxidation layer consists of $Al_xGa_{1-x}As$.

18. The method according to claim 15, wherein the antioxidation layer consists of a chemically selective etch stop layer.

19. The method according to claim 18, wherein the antioxidation layer consists of $In_yAl_xGa_{1-x-y}As_{1-z}P_z$.

20. A method for fabricating a laser diode, which comprises:
providing the laser diode with a vertical resonator having at least one active layer disposed between reflector layers;
providing at least one antioxidation layer consisting of a III–V semiconductor material with an optical thickness of at least two quarter-wavelengths and configuring the antioxidation layer between the reflector layers;
providing at least one current aperture layer;
constructing the antioxidation layer as an etch stop layer and/or an etch runout layer; and
disposing the antioxidation layer between the plurality of reflector layers and above the current aperture layer.

21. A method for fabricating a laser diode, which comprises:
providing the laser diode with a vertical resonator having at least one active layer disposed between reflector layers;
providing at least one antioxidation layer consisting of a III–V semiconductor material with an optical thickness of at least two quarter-wavelengths and configuring the antioxidation layer between the reflector layers;
providing at least one current aperture layer;
providing a coverlayer for protecting layers being uncovered after an etching process against oxidation during processing steps subsequent to the etching process; and
disposing the antioxidation layer above the current aperture layer.

22. The method according to claim 20, wherein the III–V semiconductor material of the antioxidation layer has a molar aluminum fraction of less than 0.7.

23. The method according to claim 20, wherein the antioxidation layer consists of $Al_xGa_{1-x}As$.

24. The method according to claim 20, wherein the antioxidation layer consists of a chemically selective etch stop layer.

25. The method according to claim 24, wherein the antioxidation layer consists of $In_yAl_xGa_{1-x-y}As_l$.

26. The method according to claim 21, wherein the III–V semiconductor material of the antioxidation layer has a molar aluminum fraction of less than 0.7.

27. The method according to claim 21, wherein the antioxidation layer consists of $Al_xGa_{1-x}As$.

28. The method according to claim 21, wherein the antioxidation layer consists of a chemically selective etch stop layer.

29. The method according to claim 28, wherein the antioxidation layer consists of $In_yAl_xGa_{1-x-y}As_{1-z}P_z$.

30. The laser diode according to claim 12, wherein said antioxidation layer consists only of said III–V semiconductor material.

31. The laser diode according to claim 12, wherein said antioxidation layer consists of said III–V semiconductor material with a molar aluminum fraction of less than 0.7.

32. The laser diode according to claim 12, wherein said antioxidation layer consists of $Al_xGa_{1-x}As$ or a chemically selective etch stop layer.

33. The laser diode according to claim 12, wherein said antioxidation layer consists of $In_yAl_xGa_{1-x-y}As_{1-z}P_z$.

34. The laser diode according to claim 12, wherein said antioxidation layer is disposed above said active layer.

35. The laser diode according to claim 12, wherein said antioxidation layer is disposed below said active layer.

36. The laser diode according to claim 12, wherein said antioxidation layer is constructed as an etch stop layer and/or an etch runout layer.

37. The laser diode according to claim 12, wherein said antioxidation layer is at least partly modulation-doped.

38. The laser diode according to claim 12, wherein at least one of said plurality of reflector layers includes a molar aluminum fraction of less than 0.9.

39. The laser diode according to claim 12, wherein at least one of said plurality of reflector layers, which is adjacent said active layer, includes a molar aluminum fraction of less than 0.9.

40. The laser diode according to claim 13, wherein said antioxidation layer consists only of said III–V semiconductor material.

41. The laser diode according to claim 13, wherein said antioxidation layer consists of said III–V semiconductor material with a molar aluminum fraction of less than 0.7.

42. The laser diode according to claim 13, wherein said antioxidation layer consists of $Al_xGa_{1-x}As$ or a chemically selective etch stop layer.

43. The laser diode according to claim 13, wherein said antioxidation layer consists of $In_yAl_xGa_{1-x-y}As_{1-z}P_z$.

44. The laser diode according to claim 13, wherein said antioxidation layer is disposed above said active layer.

45. The laser diode according to claim 13, wherein said antioxidation layer is disposed below said active layer.

46. The laser diode according to claim 13, wherein said antioxidation layer is constructed as an etch stop layer and/or an etch runout layer.

47. The laser diode according to claim 13, wherein said antioxidation layer is at least partly modulation-doped.

48. The laser diode according to claim 13, wherein at least one of said plurality of reflector layers includes a molar aluminum fraction of less than 0.9.

49. The laser diode according to claim 13, wherein at least one of said plurality of reflector layers, which is adjacent said active layer, includes a molar aluminum fraction of less than 0.9.

* * * * *